United States Patent
Wu et al.

(10) Patent No.: US 10,176,041 B2
(45) Date of Patent: Jan. 8, 2019

(54) DETERMINISTIC READ RETRY METHOD FOR SOFT LDPC DECODING IN FLASH MEMORIES

(71) Applicant: Tidal Systems, Inc., Santa Clara, CA (US)

(72) Inventors: Yingquan Wu, Palo Alto, CA (US); Armin Banaei, Sunnyvale, CA (US)

(73) Assignee: Tidal Systems, Inc., Santa Clara, CA (US)

(*) Notice: Subject to any disclaimer, the term of this patent is extended or adjusted under 35 U.S.C. 154(b) by 496 days.

(21) Appl. No.: 14/305,958

(22) Filed: Jun. 16, 2014

(65) Prior Publication Data
US 2015/0365106 A1  Dec. 17, 2015

(51) Int. Cl.
| H03M 13/00 | (2006.01) |
| G06F 11/10 | (2006.01) |
| H03M 13/11 | (2006.01) |
| H03M 13/37 | (2006.01) |

(52) U.S. Cl.
CPC ..... G06F 11/1068 (2013.01); H03M 13/1111 (2013.01); H03M 13/3723 (2013.01); H03M 13/6325 (2013.01)

(58) Field of Classification Search
CPC ...... G06F 11/10; G06F 11/1068; G11C 16/10; G11C 27/00; H03M 13/00; H03M 13/05; H03M 13/11; H03M 13/1111; H03M 13/1125; H03M 13/29; H03M 13/3723; H03M 13/45; H03M 13/6325
See application file for complete search history.

(56) References Cited

U.S. PATENT DOCUMENTS

| 2005/0047533 | A1* | 3/2005 | Ruelke | H03G 3/001 375/345 |
| 2005/0180520 | A1* | 8/2005 | Kim | H04L 25/03312 375/287 |
| 2008/0165903 | A1* | 7/2008 | Hooli | H04B 1/70753 375/343 |
| 2012/0213001 | A1* | 8/2012 | Yang | G06F 11/1048 365/185.2 |
| 2013/0163328 | A1* | 6/2013 | Karakulak | G11C 16/10 365/185.2 |
| 2013/0297988 | A1* | 11/2013 | Wu | G06F 11/1068 714/773 |
| 2014/0040704 | A1* | 2/2014 | Wu | G11C 29/52 714/773 |

(Continued)

Primary Examiner — Guy J Lamarre
Assistant Examiner — Enamul M Kabir
(74) Attorney, Agent, or Firm — Brooks, Cameron & Huebsch, PLLC (57) ABSTRACT

A method is disclosed for performing LDPC soft decoding of data stored in a flash storage device. Upon occurrence of a hard read failure, one or more retries with soft decoding after each retry are performed until soft decoding is successful or a maximum iteration count is reached. For each retry thresholds for sensing a level of a cell are adjusted according to a specific sequence. Likewise, the LLR table for each retry is selected from pre-determined LLR tables each corresponding to a retry attempt and the thresholds used for the retry attempt. The LLR table is not adjusted between retries or based on outcomes of any retries. A step size by which thresholds adjusted may be tuned to improve performance.

17 Claims, 6 Drawing Sheets

(56) References Cited

U.S. PATENT DOCUMENTS

| | | | |
|---|---|---|---|
| 2014/0281785 A1* | 9/2014 | Fainzilber | H03M 13/1108 714/752 |
| 2014/0325310 A1* | 10/2014 | Anholt | G06F 11/1072 714/764 |
| 2015/0242268 A1* | 8/2015 | Wu | G06F 11/1012 714/773 |

* cited by examiner

Fig. 6

DETERMINISTIC READ RETRY METHOD FOR SOFT LDPC DECODING IN FLASH MEMORIES

BACKGROUND

Field of the Invention

This invention relates to systems and methods for implementing a low density parity check (LDPC) decoding algorithm.

Background of the Invention

In flash memories, a read operation returns one bit for each cell of a page. With processors becoming smaller and smaller in order to scale down power and increase capacity, the data has become noisier and noisier. To effectively combat ever greater noise, the next generation controller technology is migrating from conventional BCH coding to the capacity approaching LDPC coding. For practical application of high rate (>0.8) codes, LDPC hard correction capability is not much different from that of BCH codes, however, in case of hard read failure, multiple reads may be combined to enable efficient LDPC soft decoding, whereas efficient soft decoding of BCH codes has not been discovered up-to-date.

In conventional LDPC decoding, multiple reads are combined to generate parameters used to perform soft decoding of a parity code. However, this is computationally expensive and therefore costs time and power.

The systems and methods disclosed herein provide an improved approach for performing soft decoding of an LDPC code.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

The invention has been developed in response to the present state of the art and, in particular, in response to the problems and needs in the art that have not yet been fully solved by currently available apparatus and methods. Accordingly, the invention has been developed to provide apparatus and methods performing LDPC decoding.

In some embodiments, a computer system including a processor and a storage device is programmed to:

(a) perform an initial read of a code word from a plurality of cells of the storage device using one or more threshold levels;

(b) adjust the one or more threshold levels to obtain one or more current threshold levels based on an iteration count;

(c) retry reading the code word from the plurality of cells of the storage device using the one or more current threshold levels;

(d) attempt to decode the code word using a log likelihood ratio (LLR) table of a plurality of LLR tables, outcomes of the initial read (a) and one or more retry readings (d), each LLR table of the plurality of LLR tables corresponding to the iteration count; and (e) if attempting to decode the code word at (c) is unsuccessful and the iteration count is less than a maximum iteration count, iterate steps (b) through (d).

In another aspect of the invention, entries of the plurality of LLR tables are fixed prior to performing (b) through (e) and are not adjusted as a result of the read retries or decoding attempts.

In another aspect of the invention, each LLR table of the plurality of LLR tables includes entries for less than all possible outcomes of outcomes of retrying reading the code word from the plurality of cells at (c) for the iteration count corresponding to the each LLR table.

In another aspect of the invention, the entries of each LLR table of the plurality of LLR tables include entries selected according to probable outcomes for the current threshold levels for the iteration count corresponding to the each LLR table.

The storage device may be a NAND flash device. The NAND flash device may be a multi-level cell (MLC) device including two or three levels.

In another aspect of the invention, adjusting the one or more threshold levels to obtain the one or more current threshold levels based on the iteration count includes adjusting a plurality of thresholds according to two or more different step sizes.

Embodiments in accordance with the present invention may be embodied as an apparatus, method, or computer program product. Accordingly, the present invention may take the form of an entirely hardware embodiment, an entirely software embodiment (including firmware, resident software, micro-code, etc.), or an embodiment combining software and hardware aspects that may all generally be referred to herein as a "module" or "system." Furthermore, the present invention may take the form of a computer program product embodied in any tangible medium of expression having computer-usable program code embodied in the medium.

Any combination of one or more computer-usable or computer-readable media may be utilized, including non-transitory media. For example, a computer-readable medium may include one or more of a portable computer diskette, a hard disk, a random access memory (RAM) device, a read-only memory (ROM) device, an erasable programmable read-only memory (EPROM or Flash memory) device, a portable compact disc read-only memory (CDROM), an optical storage device, and a magnetic storage device. In selected embodiments, a computer-readable medium may comprise any non-transitory medium that can contain, store, communicate, propagate, or transport the program for use by or in connection with the instruction execution system, apparatus, or device.

Computer program code for carrying out operations of the present invention may be written in any combination of one or more programming languages, including an object-oriented programming language such as Java, Smalltalk, C++, or the like and conventional procedural programming languages, such as the "C" programming language or similar programming languages. The program code may execute entirely on a computer system as a stand-alone software package, on a stand-alone hardware unit, partly on a remote computer spaced some distance from the computer, or entirely on a remote computer or server. In the latter scenario, the remote computer may be connected to the computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions or code. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a non-transitory computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 1:
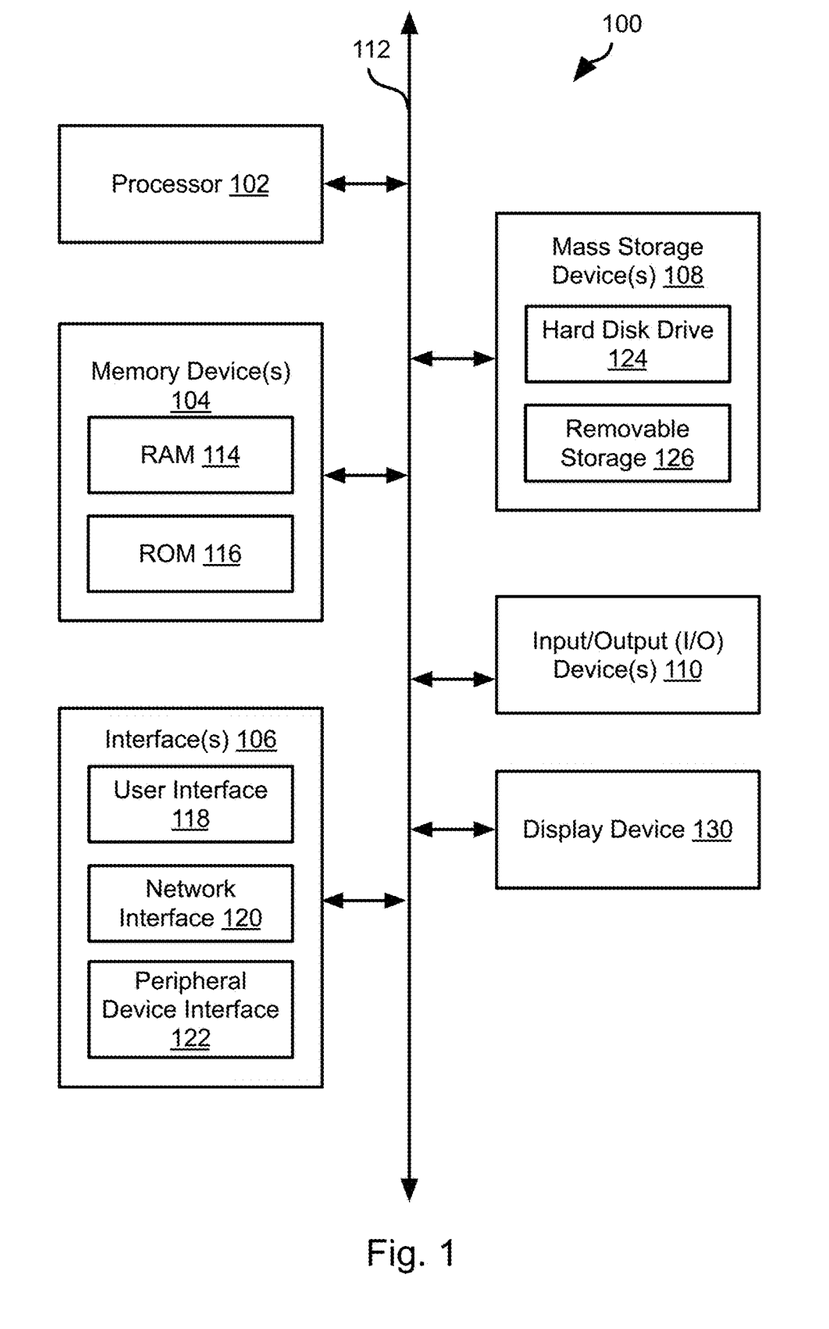
FIG. 1 is a schematic block diagram of a computer system suitable for implementing methods in accordance with embodiments of the invention.

FIG. 1 is a block diagram illustrating an example computing device 100. Computing device 100 may be used to perform various procedures, such as those discussed herein. Computing device 100 can function as a server, a client, or any other computing entity. Computing device can perform various monitoring functions as discussed herein, and can execute one or more application programs, such as the application programs described herein. Computing device 100 can be any of a wide variety of computing devices, such as a desktop computer, a notebook computer, a server computer, a handheld computer, tablet computer and the like.

Computing device 100 includes one or more processor(s) 102, one or more memory device(s) 104, one or more interface(s) 106, one or more mass storage device(s) 108, one or more Input/Output (I/O) device(s) 110, and a display device 130 all of which are coupled to a bus 112. Processor(s) 102 include one or more processors or controllers that execute instructions stored in memory device(s) 104 and/or mass storage device(s) 108. Processor(s) 102 may also include various types of computer-readable media, such as cache memory.

Memory device(s) 104 include various computer-readable media, such as volatile memory (e.g., random access memory (RAM) 114) and/or nonvolatile memory (e.g., read-only memory (ROM) 116). Memory device(s) 104 may also include rewritable ROM, such as Flash memory.

Mass storage device(s) 108 include various computer readable media, such as magnetic tapes, magnetic disks, optical disks, solid-state memory (e.g., Flash memory), and so forth. As shown in FIG. 1, a particular mass storage device is a hard disk drive 124. Various drives may also be included in mass storage device(s) 108 to enable reading from and/or writing to the various computer readable media. Mass storage device(s) 108 include removable media 126 and/or non-removable media.

I/O device(s) 110 include various devices that allow data and/or other information to be input to or retrieved from computing device 100. Example I/O device(s) 110 include cursor control devices, keyboards, keypads, microphones, monitors or other display devices, speakers, printers, network interface cards, modems, lenses, CCDs or other image capture devices, and the like.

Display device 130 includes any type of device capable of displaying information to one or more users of computing device 100. Examples of display device 130 include a monitor, display terminal, video projection device, and the like.

Interface(s) 106 include various interfaces that allow computing device 100 to interact with other systems, devices, or computing environments. Example interface(s) 106 include any number of different network interfaces 120, such as interfaces to local area networks (LANs), wide area networks (WANs), wireless networks, and the Internet. Other interface(s) include user interface 118 and peripheral device interface 122. The interface(s) 106 may also include one or more user interface elements 118. The interface(s) 106 may also include one or more peripheral interfaces such as interfaces for printers, pointing devices (mice, track pad, etc.), keyboards, and the like.

Bus 112 allows processor(s) 102, memory device(s) 104, interface(s) 106, mass storage device(s) 108, and I/O device(s) 110 to communicate with one another, as well as other devices or components coupled to bus 112. Bus 112 represents one or more of several types of bus structures, such as a system bus, PCI bus, IEEE 1394 bus, USB bus, and so forth.

For purposes of illustration, programs and other executable program components are shown herein as discrete blocks, although it is understood that such programs and components may reside at various times in different storage components of computing device 100, and are executed by processor(s) 102. Alternatively, the systems and procedures described herein can be implemented in hardware, or a combination of hardware, software, and/or firmware. For example, one or more application specific integrated circuits (ASICs) can be programmed to carry out one or more of the systems and procedures described herein.

In this application, present a deterministic read retry method is disclosed that for generating soft information for LDPC soft decoding, which avoids all on-the-fly computations of parameters.

The disclosed algorithm relies on two assumptions that conform closely to actual practices. The first assumption is that provided thresholds are near optimal, i.e. substantially close to an optimal threshold (e.g. within +/−5%). This is because offline tracking is typically performed regularly to set optimal thresholds and ensure that data drift due to short time retention is negligible. On the other hand, when long time retention happens on rare occasions, tracking may first be deployed to determine optimal thresholds. The second assumption is that all non-erasure levels are identically distributed. In real scenarios, the distributions of all non-erasure levels are approximately identical, while the higher levels exhibit slightly larger deviations. The erasure level typically has much wider distribution than a non-erasure level. But some embodiments may simply treat erasure level as a non-erasure level inasmuch as only the upper tail of erasure level may be read and measured by the vendor provided read shift mechanism.

The disclosed method further assumes that the fixed-point LLR (log likelihood ratio) values are practically under the same scale as the number of retries. Therefore, the flexibility of optimal LLR values is therefore highly limited. The following algorithm is deterministic algorithm for 2-bit MLC (multi-level cell) NAND. However, the disclosed algorithm may be generalized to SLC (single-level cell) NAND or three or more level cells (TLC).

Figure 2:
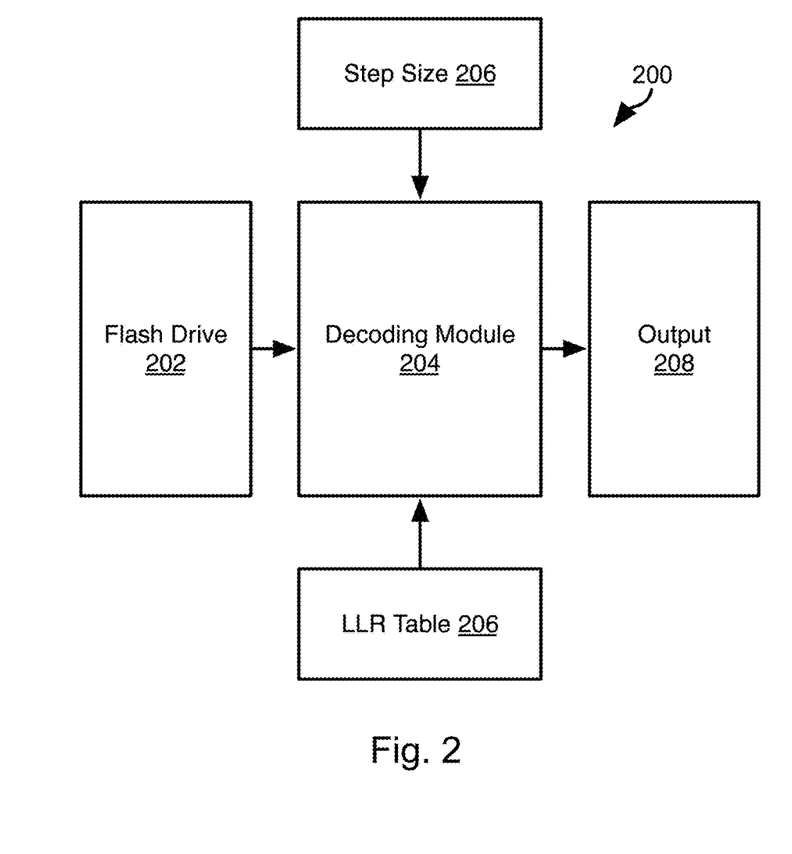
FIG. 2 is a schematic block diagram of components for implementing methods in accordance with embodiments of the invention.

Referring to FIG. 2, the illustrated system may be used to perform the methods disclosed herein. The illustrated components may be specific electronic components or software modules executed by a computing device 100. The system 200 may include a flash drive 202, such as a SLC, 2-level MLC NAND flash drive, 3-level MLC NAND flash drive, or some other type of flash drive.

A decoding module 204 receives data read from the flash drive 202 and/or performs reading of data from the flash drive 202. The decoding module 204 may read data in pages of some fixed length or a code word for performing error correction according to an error correction algorithm (e.g. LDPC error correction).

The decoding module 204 may perform a decoding algorithm using one or both of a step size 206 and one or more LLR tables 206. Upon decoding a word according to the methods described herein, the decoding module 204 may provide an output that is either successfully decoded data or an indication that decoding was unsuccessful.

Deterministic Read Retry Algorithm for MLC

Figure 3:
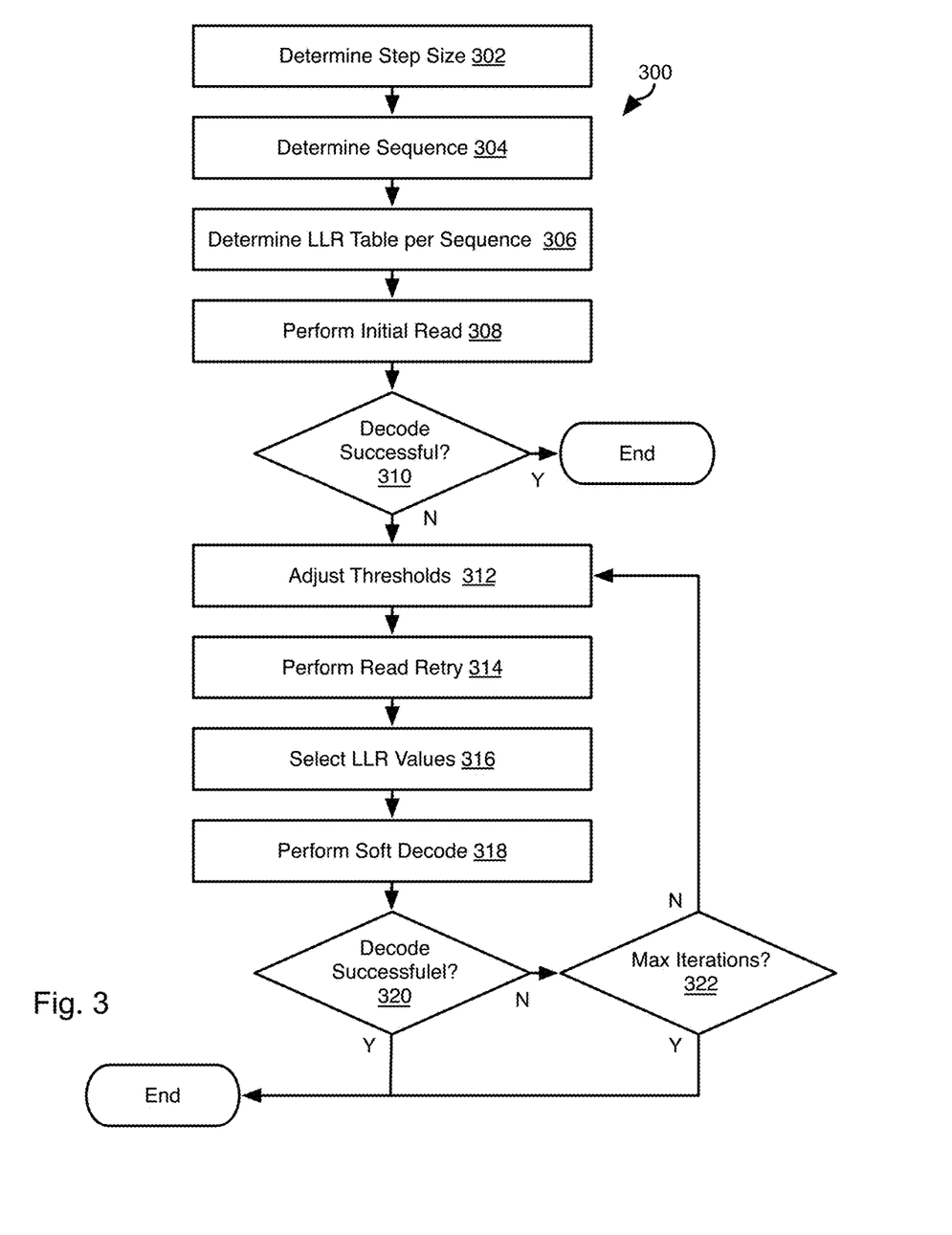
FIG. 3 is a process flow diagram of a method in accordance with an embodiment of the present invention.

Referring to FIG. 3, a method 300 may include determining 302 a step size for a given device. The step size may be determined experimentally by performing the method 300 for various step sizes and determining which step size provides optimized or near optimal performance with respect to the step sizes test. In a multi-level cell (MLC), multiple thresholds may be used to distinguish between different levels. Different step sizes may be used to adjust each threshold according to the method 300.

For example, for purposes of the method 300 the step sizes correspond to thresholds $\theta_0^{(0)}$, $\theta_1^{(0)}$, $\theta_2^{(0)}$ may be designated as $\Delta_0$, $\Delta_1$, $\Delta_2$. In some embodiments, $\Delta_0$, $\Delta_1$, $\Delta_2$ may be equal to one another. In other embodiments, the step sizes may have two or more different values.

A fixed log likelihood ratio (LLR) table may be used for performing LDPC soft decoding. In particular, for each read retry, a corresponding fixed LLR table may be defined. In particular LLR tables $L_j^{(i)}$, j=0, 1, . . . , i+1, i=1, 2, . . . , 6 may be defined, where superscript $^{(i)}$ denotes the i-th retry read The thresholds $\theta_0^{(0)}$, $\theta_1^{(0)}$, $\theta_2^{(0)}$ may be determined experimentally and may be chosen to provide optimal, or near optimal, performance in terms of errors or some other metric. The initial values for the thresholds may be determined according to any method known in the art.

The method 300 may further include determining 304 a sequence of threshold adjustments and determining 306 the LLR table values according to the sequence. In particular, a subset of possible outcomes for retry attempts may be selected according to the sequence of threshold adjustments. Steps 302-306 may be performed as a calibration step performed by a manufacturer whereas the following steps may be performed during use of a device.

The method 300 may include performing 308 an initial read of a code word and determining 310 whether the code word decodes successfully. The initial read may be performed with respect to the initial threshold values and may be a "hard read" that simply performs LDPC decoding, or some other parity check, with respect to levels sensed during the read and the thresholds.

If decoding is found 310 to be successful, the method 300 may end. If not, the method 300 may include adjusting 312 the thresholds according to the sequence determined at step 304 and performing 314 another read attempt. The LLR table for the read attempt (e.g. j=0 for the first read attempt, j=1 for the second read attempt) may be selected 316. The bits and/or voltages of the read step 314 may then be soft decoded 318 as known in the art using the threshold levels as adjusted at step 312 and the LLR table selected at step 316. The read step 314 may include reading an entire page or error correction code word that is used for performing the soft decode 318 according to an error correction algorithm, such as an LDPC error correction scheme.

After performing 318 soft decoding, the method 300 may include evaluating 320 whether decoding was successful. A decoding may be successful if the code word as read at step 308 was successfully decoded according to the error correction scheme, i.e. the data encoded in the code word was successfully extracted. If the code is found 316 not to have been successfully decoded, then steps 312-318 may be repeated if a maximum number of iterations (e.g. 6) is not found 322 to have been exceeded. If the number of maximum iterations is exceeded, the method 300 may end. The adjustments 312 and LLR values selected 316 may change for each iteration according to the sequence determined at steps 304.

For example, the method 300 may be performed as follows:

1. Shift thresholds:

$\theta_0^{(1)} = \theta_0^{(0)} - 2\Delta_0, \theta_1^{(1)} = \theta_1^{(0)} - 2\Delta_1, \theta_2^{(1)} = \theta_2^{(0)} + 2\Delta_2$ 2. Read and set LLR map:

$L(1^{(0)}1^{(1)}) = L_0^{(1)}, L(1^{(0)}0^{(1)}) = L_1^{(1)}, L(0^{(0)}0^{(1)}) = L_2^{(1)}$

3. Apply soft decoding. Return if successful.

4. Shift thresholds:

$\theta_0^{(2)} = \theta_0^{(0)} + 2\Delta_0, \theta_1^{(2)} = \theta_1^{(0)} + 2\Delta_1, \theta_2^{(2)} = \theta_2^{(0)} - 2\Delta_2$ 5. Read and set LLR map:
$L(1^{(0)}1^{(1)}1^{(2)})=L_0^{(2)}$, $L(1^{(0)}0^{(1)}1^{(2)})=L_1^{(2)}$, $L(0^{(0)}0^{(1)}1^{(2)})=L_2^{(2)}$, $L(0^{(0)}0^{(1)}0^{(2)})=L_3^{(2)}$ 6. Apply soft decoding. Return if successful.
7. Shift thresholds:

$\theta_0^{(3)}=\theta_0^{(0)}-\Delta_0, \theta_1^{(3)}=\theta_1^{(0)}-\Delta_1, \theta_2^{(3)}=\theta_2^{(0)}+\Delta_2$ 8. Read and set LLR map:
$L(1^{(0)}1^{(1)}1^{(2)}1^{(3)})=L_0^{(3)}$, $L(1^{(0)}0^{(1)}1^{(2)}1^{(3)})=L_1^{(3)}$, $L(1^{(0)}0^{(1)}1^{(2)}0^{(3)})=L_2^{(3)}$, $L(0^{(0)}0^{(1)}1^{(2)}0^{(3)})=L_3^{(3)}$, $L(0^{(0)}0^{(1)}0^{(2)}0^{(3)})=L_4^{(3)}$ 9. Apply soft decoding. Return if successful.
10. Shift thresholds:

$\theta_0^{(4)}=\theta_0^{(0)}+\Delta_0, \theta_1^{(4)}=\theta_1^{(0)}+\Delta_1, \theta_2^{(4)}=\theta_2^{(0)}-\Delta_2$ 11. Read and set LLR map:
$L(1^{(0)}1^{(1)}1^{(2)}1^{(3)}1^{(4)})=L_0^{(4)}$, $L(1^{(0)}0^{(1)}1^{(2)}1^{(3)}1^{(4)})=L_1^{(4)}$, $L(1^{(0)}0^{(1)}1^{(2)}0^{(3)}1^{(4)})=L_2^{(4)}$, $L(0^{(0)}0^{(1)}1^{(2)}0^{(3)}1^{(4)})=L_3^{(4)}$, $L(0^{(0)}0^{(1)}1^{(2)}0^{(3)}0^{(4)})=L_4^{(4)}$, $L(0^{(0)}0^{(1)}0^{(2)}0^{(3)}0^{(4)})=L_5^{(4)}$ 12. Apply soft decoding. Return if successful.
13. Shift thresholds:

$\theta_0^{(5)}=\theta_0^{(0)}-3\Delta_0, \theta_1^{(5)}=\theta_1^{(0)}-3\Delta_1, \theta_2^{(5)}=\theta_2^{(0)}+3\Delta_2$ 14. Read and set LLR map:
$L(1^{(0)}1^{(1)}1^{(2)}1^{(3)}1^{(4)}1^{(5)})=L_0^{(5)}$, $L(1^{(0)}1^{(1)}1^{(2)}1^{(3)}1^{(4)}0^{(5)})=L_1^{(5)}$, $L(1^{(0)}0^{(1)}1^{(2)}1^{(3)}1^{(4)}0^{(5)})=L_2^{(5)}$, $L(1^{(0)}0^{(1)}1^{(2)}0^{(3)}1^{(4)}0^{(5)})=L_3^{(5)}$, $L(0^{(0)}0^{(1)}1^{(2)}0^{(3)}1^{(4)}0^{(5)})=L_4^{(5)}$, $L(0^{(0)}0^{(1)}1^{(2)}0^{(3)}0^{(4)}0^{(5)})=L_5^{(5)}$, $L(0^{(0)}0^{(1)}0^{(2)}0^{(3)}0^{(4)}0^{(5)})=L_6^{(5)}$ 15. Apply soft decoding. Return if successful.
16. Shift thresholds:

$\theta_0^{(6)}=\theta_0^{(0)}+3\Delta_0, \theta_1^{(6)}=\theta_1^{(0)}+3\Delta_1, \theta_2^{(6)}=\theta_2^{(0)}-3\Delta_2$ 17. Read and set LLR map:
$L(1^{(0)}1^{(1)}1^{(2)}1^{(3)}1^{(4)}1^{(5)}1^{(6)})=L_0^{(6)}$, $L(1^{(0)}1^{(1)}1^{(2)}1^{(3)}1^{(4)}0^{(5)}1^{(6)})=L_1^{(6)}$, $L(1^{(0)}0^{(1)}1^{(2)}1^{(3)}1^{(4)}0^{(5)}1^{(6)})=L_2^{(6)}$, $L(1^{(0)}0^{(1)}1^{(2)}0^{(3)}1^{(4)}0^{(5)}1^{(6)})=L_3^{(6)}$, $L(0^{(0)}0^{(1)}1^{(2)}0^{(3)}1^{(4)}0^{(5)}1^{(6)})=L_4^{(6)}$, $L(0^{(0)}0^{(1)}1^{(2)}0^{(3)}0^{(4)}0^{(5)}1^{(6)})=L_5^{(6)}$, $L(0^{(0)}0^{(1)}0^{(2)}0^{(3)}0^{(4)}0^{(5)}1^{(6)})=L_6^{(6)}$, $L(0^{(0)}0^{(1)}0^{(2)}0^{(3)}0^{(4)}0^{(5)}0^{(6)})=L_7^{(6)}$ 18. Apply soft decoding. Return decoding status.

Figure 4:
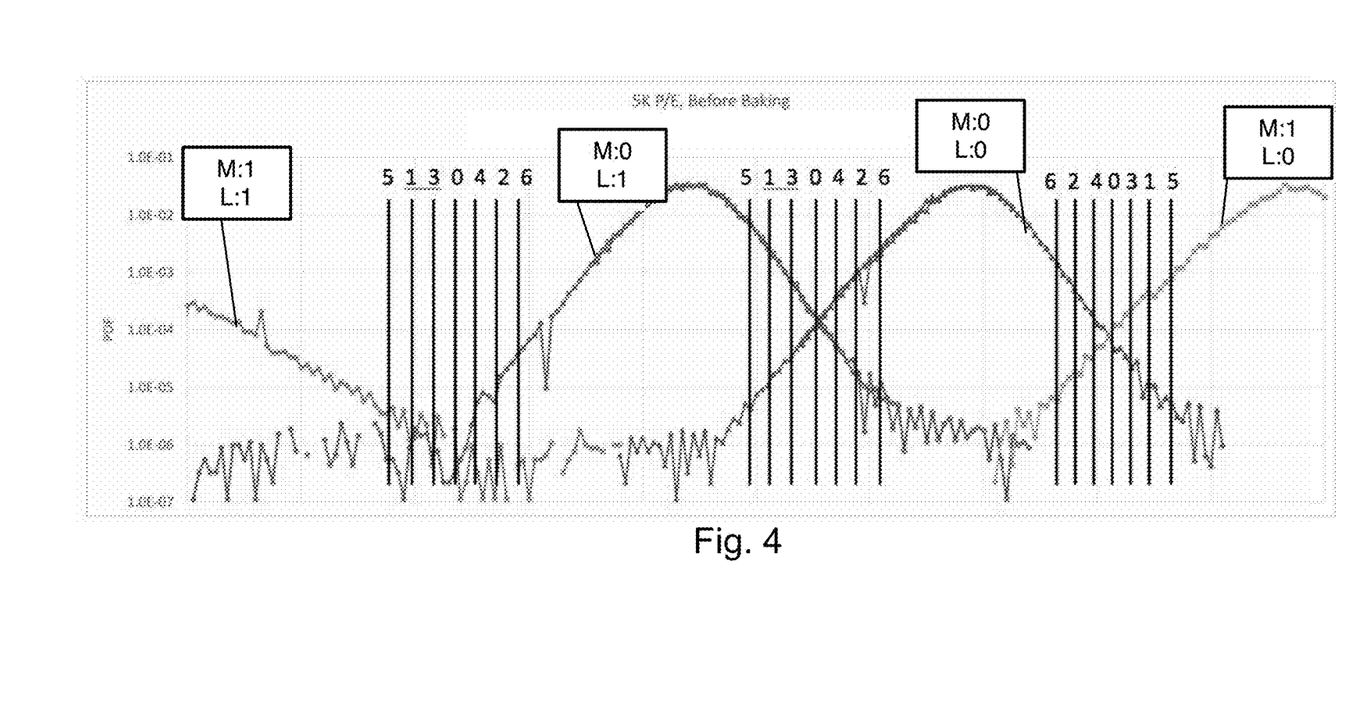
FIG. 4 is a plot of probability distributions and threshold levels in accordance with an embodiment of the present invention.

In the above algorithm, $b^{(0)}b^{(1)}\ldots b^{(i)}$ denotes the read bit sequence of a cell (using different thresholds). Totally 6 read retries are applied in the illustrated embodiment. However, more or fewer read retries may be performed. It is shown that, under AWGN (additive white Gaussian noise) channel, the performance of 6 read retries is within 0.1 dB away from that of floating-point resolution. The LLR mapping values $L_j^{(i)}$, $j=0, 1, \ldots, i+1$, $i=1, 2, \ldots, 6$, are also pre-determined, to reduce the decoding failure probability for each read. When 5-bit resolution is used, the LLR mapping values for AWGN channel are optimized, i.e. chosen to provide improved results with respect to some or all of a range of alternative values, as follows $L^{(1)}=\{12\ 3\ -8\}$
$L^{(2)}=\{12\ 3\ -3\ -12\}$
$L^{(3)}=\{12\ 5\ 2\ -3\ -12\}$
$L^{(4)}=\{12\ 5\ 2\ -2\ -5\ -12\}$
$L^{(5)}=\{15\ 8\ 5\ 2\ -2\ -5\ -12\}$
$L^{(6)}=\{15\ 8\ 5\ 2\ -2\ -5\ -8\ -15\}$ The 4-bit LLR mapping values for AWGN channel are given below, which yield about 0.05 dB SNR degradation over the above 5-bit LLR values $L^{(1)}=\{6\ 2\ -5\}$
$L^{(2)}=\{6\ 2\ -2\ -6\}$
$L^{(3)}=\{6\ 3\ 1\ -2\ -6\}$
$L^{(4)}=\{6\ 3\ 1\ -1\ -3\ -6\}$
$L^{(5)}=\{7\ 4\ 2\ 1\ -1\ -3\ -6\}$
$L^{(6)}=\{7\ 4\ 2\ 1\ -1\ -2\ -4\ -7\}$ The read threshold sequence is depicted in FIG. 4, wherein "M" and "L" denote MSB (most significant bit) and LSB (least significant bit) pages, respectively. As is apparent in FIG. 4, the sequence of adjusting the threshold may proceed as shown by the numerals (1 through 6) above the threshold. Each numeral indicating for which retry attempt the threshold shown by the vertical line below the each numeral was used. The LLR table values, as noted above, are selected based on this sequence in order to correspond to likely outputs based on the adjustment.

FIG. 4 shows the sequence for shifting the thresholds using the step sizes $\Delta_1, \Delta_2, \Delta_3$. As noted above, the step sizes for each threshold may be equal, $\Delta=\Delta_1=\Delta_2=\Delta_3$, regardless of actual distribution variance. To this end, $\Delta$ may be experimentally determined to reduce decoding failure probability. Note $\Delta$ may be code (particularly code-rate) dependent. Accordingly, the step size $\Delta$ may be experimentally determined for a particular code. Generally, the higher the code rate gets, the smaller the optimal step size $\Delta$ tends to get.

Note that many flash vendors intentionally force the raw BER (bit error rate) associated with the middle threshold $\theta_1$ to be roughly twice that of the $\theta_0, \theta_2$ thresholds, in order to equalize the number of bit errors page-wise. A more complex way is to set three step sizes such that $\Delta_0=\Delta_2>\Delta_1$. We may further assume the raw BER of the first and third thresholds differ substantially as well, and thus set three step sizes, $\Delta_0, \Delta_1, \Delta_2$, distinctively.

Figure 5:
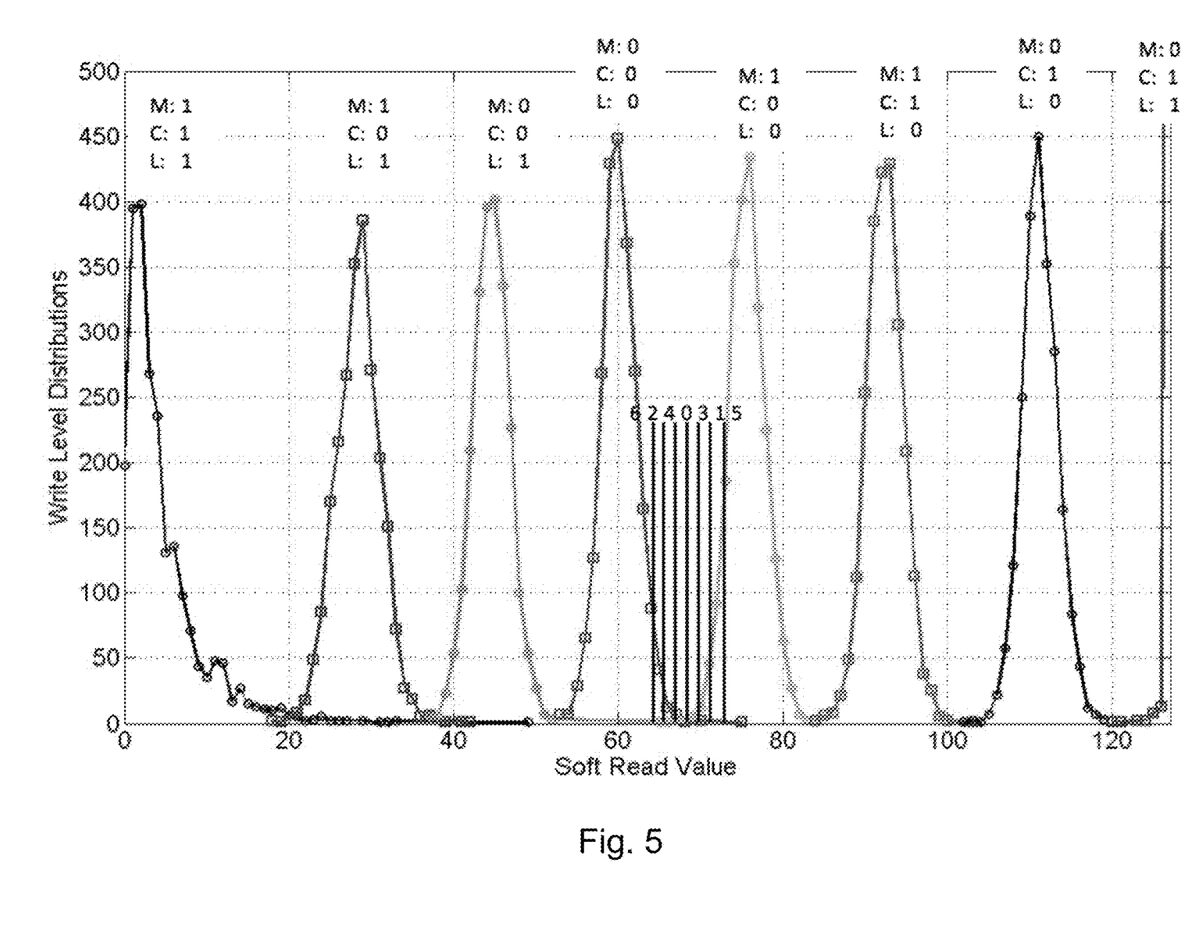
FIG. 5 is a plot of probability distributions and threshold levels for a three-level cell in accordance with an embodiment of the present invention.
Figure 6:
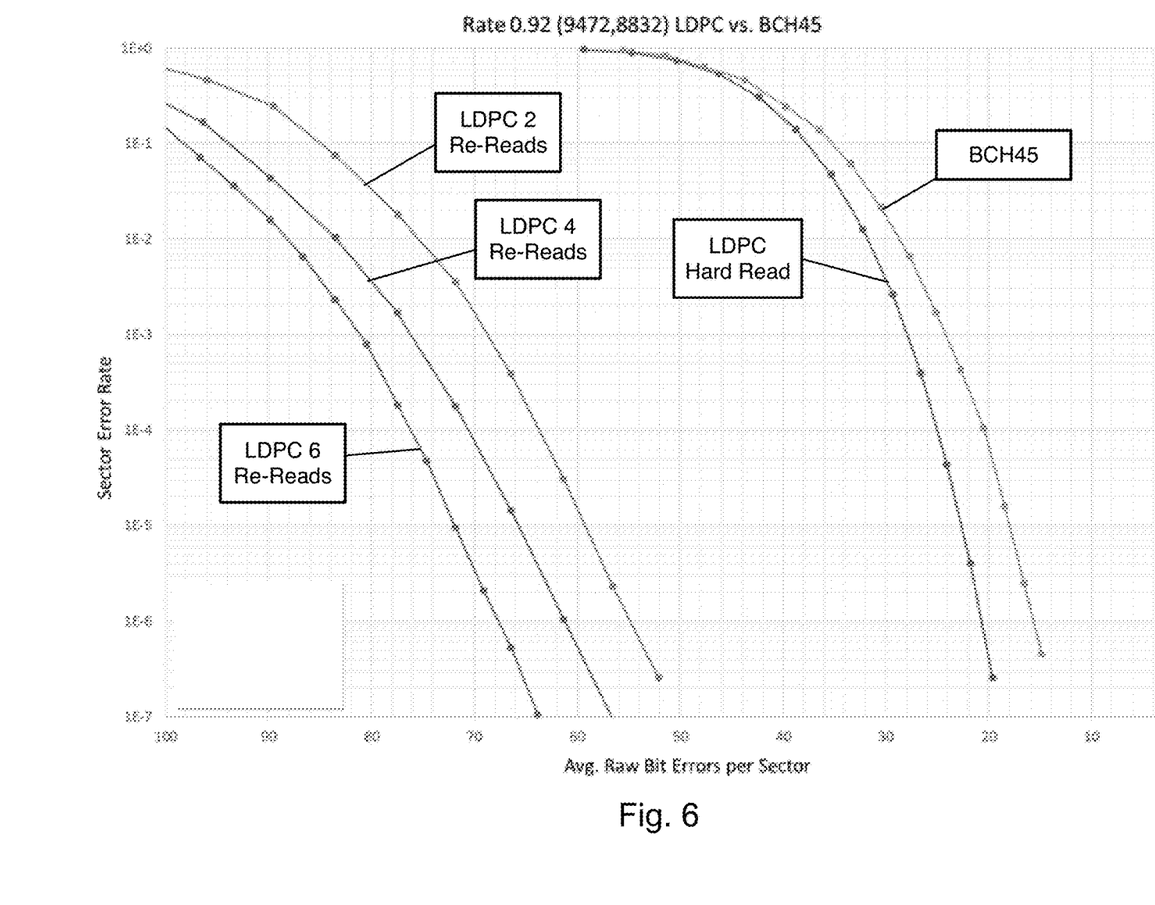
FIG. 6 is a plot of bit error rates for prior-art decoding schemes and decoding in accordance with an embodiment of the present invention.

The aforementioned retry algorithm can be readily extended for the TLC (two level cell) NAND, as shown in FIG. 5 (wherein "M", "C", "L", denote MSB, CSB, LSB pages, respectively). Specifically, the mere difference is the threshold shift sequence applied, as follows $\Delta[\theta_0^{(1)}, \theta_1^{(1)}, \theta_2^{(1)}, \theta_3^{(1)}, \theta_4^{(1)}, \theta_5^{(1)}, \theta_6^{(1)}]=-2\cdot[\Delta_0, \Delta_1, \Delta_2, -\Delta_3, -\Delta_4, \Delta_5, -\Delta_6]$ $\Delta[\theta_0^{(2)}, \theta_1^{(2)}, \theta_2^{(2)}, \theta_3^{(2)}, \theta_4^{(2)}, \theta_5^{(2)}, \theta_6^{(2)}]=2\cdot[\Delta_0, \Delta_1, \Delta_2, -\Delta_3, -\Delta_4, \Delta_5, -\Delta_6]$ $\Delta[\theta_0^{(3)}, \theta_1^{(3)}, \theta_2^{(3)}, \theta_3^{(3)}, \theta_4^{(3)}, \theta_5^{(3)}, \theta_6^{(3)}]=-1\cdot[\Delta_0, \Delta_1, \Delta_2, -\Delta_3, -\Delta_4, \Delta_5, -\Delta_6]$ $\Delta[\theta_0^{(4)}, \theta_1^{(4)}, \theta_2^{(4)}, \theta_3^{(4)}, \theta_4^{(4)}, \theta_5^{(4)}, \theta_6^{(4)}]=1\cdot[\Delta_0, \Delta_1, \Delta_2, -\Delta_3, -\Delta_4, \Delta_5, -\Delta_6]$ $\Delta[\theta_0^{(5)}, \theta_1^{(5)}, \theta_2^{(5)}, \theta_3^{(5)}, \theta_4^{(5)}, \theta_5^{(5)}, \theta_6^{(5)}]=-3\cdot[\Delta_0, \Delta_1, \Delta_2, -\Delta_3, -\Delta_4, \Delta_5, -\Delta_6]$ $\Delta[\theta_0^{(6)}, \theta_1^{(6)}, \theta_2^{(6)}, \theta_3^{(6)}, \theta_4^{(6)}, \theta_5^{(6)}, \theta_6^{(6)}]=3\cdot[\Delta_0, \Delta_1, \Delta_2, -\Delta_3, -\Delta_4, \Delta_5, -\Delta_6]$ where $\Delta(\theta_k^{(i)})\square\theta_k^{(i)}-\theta_k^{(0)}$, $i=1, 2, \ldots, 6$, $k=0, 1, 2, \ldots, 6$ An example of simulation performance comparison over AWGN channel is depicted in FIG. 6. Note there is significant gain from the first two retry reads, whereas the gain diminishes quickly for the remaining 4 retry reads. It clearly demonstrates that soft decoding of the LDPC code is highly advantageous over the equivalent BCH code, which exhibits an error-correction-capability of 45.

Overall, the proposed pre-optimized fixed LLR table eliminates the on-the-fly computation of LLR values during read retry process. Extensive studies performed by the inventors show that the proposed fixed LLR table performs within 0.1 dB from the dynamically computed optimal LLR values. Alternatively, in some embodiments the step size may be adjusted on the fly (during decoding of a single read operation) when necessary, however this is much simpler than adjusting the LLR table on the fly, which effectively mitigates the performance degradation due to the pre-computed LLR table.

The present invention may be embodied in other specific forms without departing from its spirit or essential characteristics. The described embodiments are to be considered in all respects only as illustrative, and not restrictive. The scope of the invention is, therefore, indicated by the appended claims, rather than by the foregoing description. All changes which come within the meaning and range of equivalency of the claims are to be embraced within their scope.

What is claimed is:

1. A computer system comprising:
   a processor; and
   a storage device comprising a plurality of memory cells;
   wherein the processor is programmed to:
   perform an initial read of a code word from the plurality of cells using one or more voltage threshold levels;
   determine a sequence of voltage threshold level adjustments;
   perform the sequence of voltage threshold level adjustments on the one or more-voltage threshold levels to obtain one or more current voltage threshold levels based on an iteration count, wherein an iteration count is a quantity of times the one or more voltage threshold levels are adjusted;
   retry reading the code word from the plurality of cells of the storage device using the one or more current voltage threshold levels;
   attempt to decode the code word using a log likelihood ratio (LLR) table of a plurality of LLR tables, each LLR table of the plurality of LLR tables corresponding to the iteration count; and
   if attempting to decode the code word is unsuccessful and the iteration count is less than a maximum iteration count, readjust the one or more voltage threshold levels using the respective sequence of voltage threshold level adjustments corresponding to the respective iteration count, retry reading the code word, and re-attempt to decode the code word;
   wherein entries of the plurality of LLR tables are determined according to the sequence of voltage threshold level adjustments, and wherein the entries of the plurality of LLR tables are fixed and are not adjusted as a result of the decoding re-attempts and the read retries.

2. The computer system of claim 1, wherein each LLR table of the plurality of LLR tables includes entries for less than all possible outcomes of outcomes of retrying reading the code word from the plurality of cells while performing the retry reading of the code word for the iteration count corresponding to the each LLR table.

3. The computer system of claim 1, wherein the storage device is a NAND flash device.

4. The computer system of claim 1, wherein the storage device is a multi-level cell NAND flash device.

5. The computer system of claim 1, wherein the storage device is a three-level cell NAND flash device.

6. The computer system of claim 1, wherein adjusting the one or more-voltage threshold levels to obtain the one or more current voltage threshold levels based on the iteration count comprises adjusting a plurality of threshold voltage levels according to two or more different step sizes.

7. The computer system of claim 1, wherein the maximum iteration count is 6.

8. The computer system of claim 1, wherein attempting to decode the code word comprises performing low density parity check (LDPC) decoding.

9. A method comprising:
   performing an initial read of a code word from a plurality of cells of a storage device using one or more voltage threshold levels;
   determining a sequence of voltage threshold adjustments;
   performing the sequence of voltage threshold level adjustments on the one or more voltage threshold levels to obtain one or more current voltage threshold levels based on an iteration count, the one or more current voltage threshold levels for each value of the iteration count having different voltage threshold levels, wherein an iteration count is a quantity of times the one or more voltage-threshold levels are adjusted;
   retrying reading the code word from the plurality of cells of the storage device using the one or more current voltage threshold levels;
   attempting to decode the code word using a log likelihood ratio (LLR) table of a plurality of LLR tables, each LLR table of the plurality of LLR tables corresponding to the iteration count; and
   if attempting to decode the code word is unsuccessful and the iteration count is less than a maximum iteration count, iterating through readjusting the one or more voltage threshold levels using the respective sequence of voltage threshold level adjustments corresponding to the respective iteration count, retrying reading of the code word, and re-attempting to decode the code word;
   wherein entries of the plurality of LLR tables are determined according to the sequence of voltage threshold level adjustments, and wherein the entries of the plurality of LLR tables are fixed and are not adjusted as a result of the decoding re-attempts and the read retries.

10. The method of claim 9, wherein each LLR table of the plurality of LLR tables includes entries for less than all possible outcomes of outcomes of retrying reading the code word from the plurality of cells while performing the retrying reading of the code word for the iteration count corresponding to the each LLR table.

11. The method of claim 9, wherein the storage device is a NAND flash device.

12. The method of claim 9, wherein the storage device is a multi-level cell NAND flash device.

13. The method of claim 9, wherein the storage device is a three-level cell NAND flash device.

14. The method of claim 9, wherein adjusting the one or more voltage threshold levels to obtain the one or more current voltage threshold levels based on the iteration count comprises adjusting a plurality of voltage threshold levels according to two or more different step sizes.

15. The method of claim 9, wherein the maximum iteration count is 6.

16. The method of claim 9, wherein attempting to decode the code word comprises performing low density parity check (LDPC) decoding.

17. The computer system of claim 1, wherein adjusting the one or more voltage threshold levels to obtain the one or more current voltage threshold levels based on the iteration count comprises adjusting the one or more voltage threshold levels according to a step size adjusted on the fly.

* * * * *